United States Patent
Lee

(10) Patent No.: US 8,319,519 B2
(45) Date of Patent: Nov. 27, 2012

(54) IMPEDANCE CODE GENERATION CIRCUIT AND INTEGRATED CIRCUIT INCLUDING THE SAME

(75) Inventor: Kwang-Su Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 48 days.

(21) Appl. No.: 12/977,842

(22) Filed: Dec. 23, 2010

(65) Prior Publication Data

US 2012/0092039 A1    Apr. 19, 2012

(30) Foreign Application Priority Data

Oct. 15, 2010    (KR) .................. 10-2010-0100673

(51) Int. Cl.
*H03K 19/003*    (2006.01)
(52) U.S. Cl. ................ 326/30; 326/26; 326/87
(58) Field of Classification Search ............ 326/21–34, 326/80–83, 86–87
See application file for complete search history.

(56) References Cited

U.S. PATENT DOCUMENTS

| 2008/0001623 A1* | 1/2008 | Kim | ............... 326/30 |
| 2008/0088338 A1* | 4/2008 | Kim | ............... 326/30 |

FOREIGN PATENT DOCUMENTS

| KR | 100532426 | 11/2005 |
| KR | 1020060032095 | 4/2006 |
| KR | 100853467 | 8/2008 |
| KR | 1020090006583 | 1/2009 |
| KR | 1020090022043 | 3/2009 |
| KR | 100937951 | 1/2010 |

OTHER PUBLICATIONS

Notice of Allowance issued by the Korean Intellectual Property Office on Dec. 26, 2011.

* cited by examiner

*Primary Examiner* — Shawki Ismail
*Assistant Examiner* — Jany Tran
(74) *Attorney, Agent, or Firm* — IP & T Group LLP

(57) ABSTRACT

An impedance code generation circuit includes an impedance unit configured to drive a calibration node to a first level by using an impedance value determined by an impedance code, a code generation unit configured to generate the impedance code so that a voltage of the calibration node has a voltage level between a first reference voltage and a second reference voltage, and a reference voltage generation unit configured to generate the first reference voltage and the second reference voltage in response to the impedance code.

21 Claims, 8 Drawing Sheets

IMPEDANCE CODE GENERATION CIRCUIT AND INTEGRATED CIRCUIT INCLUDING THE SAME

CROSS-REFERENCE TO RELATED APPLICATIONS

The present application claims priority of Korean Patent Application No. 10-2010-0100673, filed on Oct. 15, 2010, which is incorporated herein by reference in its entirety.

BACKGROUND OF THE INVENTION

Exemplary embodiments of the present invention relate to an impedance code generation circuit, which generates an impedance code for impedance matching, and an integrated circuit including the same.

A variety of integrated circuits are implemented with integrated circuit chips, such as CPUs, memories, and gate arrays. Such integrated circuits are incorporated into a variety of electrical products, such as personal computers, servers, and workstations. In most cases, integrated circuits include reception circuits configured to receive a variety of external signals through input pads, and output circuits configured to provide a variety of internal signals through output pads to external circuits.

Meanwhile, as the operating speeds of electrical products increase, swing widths of signals transferred between integrated circuits are gradually reduced in order to minimize delay time necessary for signal transfer. However, as the swing widths of the signals are reduced, the influence of external noises increases, and signal reflection at interface terminals due to impedance mismatching becomes more severe. The impedance mismatching is generally caused by external noises or variations in a power supply voltage, operating temperature, or fabrication process. The impedance mismatching may make it difficult to transfer data at high speed and may distort output data outputted from data output terminals of the integrated circuit. Therefore, in a case where the reception circuit of the integrated circuit receives the distorted output signals through the input terminals, setup/hold fail or incorrect determination of input levels may occur frequently.

In order to address the above concerns, memory devices requiring high-speed operations have adopted impedance matching circuits, called on-die termination (ODT) devices, in the vicinity of pads inside integrated circuit chips. In a typical ODT scheme, a source termination is performed at a transmission side by an output circuit, and a parallel termination is performed at a reception side by a termination circuit coupled in parallel to the reception circuit which is coupled to an input pad.

A ZQ calibration refers to a procedure of generating impedance codes which change according to variations of process, voltage, and temperature (PVT) conditions. A termination impedance value is adjusted using impedance codes generated as a result of the ZQ calibration. Generally, a pad to which an external resistor, serving as a calibration reference, is coupled is referred to as a ZQ pad. For this reason, the term "ZQ calibration" is widely used.

Hereinafter, an impedance code generation circuit (also called a calibration circuit) for generating an impedance code will be described below.

FIG. 1 is a configuration diagram of a known impedance code generation circuit.

Referring to FIG. 1, the known impedance code generation circuit includes a reference voltage generation unit 101, comparators 102 and 103, a hold signal generation unit 104, a counter 105 and an impedance unit 106.

The reference voltage generation unit 101 generates two reference voltages VREF1 and VREF2. The two reference voltages VREF1 and VREF2 have voltage levels according to the following equations: VREF1=target voltage+$\alpha$ and VREF2=target voltage−$\alpha$. The target voltage refers to a voltage that a calibration node ZQ should finally have. In general, the target voltage is VDD/2, where VDD is a power supply voltage. Thus, the reference voltage VREF1 has a voltage level of VDD/2+$\alpha$, and the reference voltage VREF2 has a voltage level of VDD/2−$\alpha$. The value of $\alpha$ determines the margin of the calibration operation.

The impedance unit 106 and a reference resistor 107 are coupled to the calibration node ZQ. The reference resistor 107 is a resistor for reference of the calibration operation. In general, the reference resistor 107 has a resistance of 240$\Omega$. The voltage of the calibration node ZQ is reduced as the total impedance (resistance) value of the impedance unit 106 increases, and the voltage of the calibration node ZQ is increased as the total impedance (resistance) value of the impedance unit 106 decreases. For example, when the total impedance value of the impedance unit 106 is greater than the resistance value of the reference resistor 107, the calibration node ZQ has a voltage lower than VDD/2. When the total impedance value of the impedance unit 106 is less than the resistance value of the reference resistor 107, the calibration node ZQ has a voltage higher than VDD/2.

The comparator 102 compares the voltage of the calibration node ZQ with the reference voltage VREF1 and generates a comparison signal UP/DN1, and the comparator 103 compares the voltage of the calibration node ZQ with the reference voltage VREF2 and generates a comparison signal UP/DN2.

The hold signal generation unit 104 deactivates a hold signal HOLD when the comparison signal UP/DN1 and the comparison signal UP/DN2 have the same value, and activates the hold signal HOLD when the comparison signal UP/DN1 and the comparison signal UP/DN2 have different values.

The counter 105 detects the comparison signal UP/DN1 in response to the hold signal HOLD and generates binary impedance codes CODE<0:4>. The generation of the impedance codes CODE<0:4> is performed by increasing or decreasing the values of the impedance codes CODE<0:4> according to a logic level of the comparison signal UP/DN1. The operation of the counter 105 is performed when the hold signal HOLD is in a deactivated state. The operation of the counter 105 is stopped when the hold signal HOLD is activated. Stopping the operation of the counter 105 means that the impedance codes CODE<0:4> are not changed.

The impedance codes CODE<0:4> generated from the counter 105 turn on/off parallel resistors within the impedance unit 106 and determine the total impedance value of the impedance unit 106.

The operation of the known impedance code generation circuit will be described below. The change in the impedance codes CODE<0:4> causes the change in the impedance value of the impedance unit 106. In addition, the changed impedance value of the impedance unit 106 changes the voltage of the calibration node ZQ. Likewise, the changed voltage of the calibration node ZQ again changes the impedance codes CODE<0:4>. Such an operation is repetitively performed until the hold signal HOLD is activated. The activation of the hold signal HOLD means that the voltage of the calibration node ZQ becomes higher than the reference voltage VREF2 and lower than the reference voltage VREF1. That is, due to the repetitive operations, the total impedance value of the impedance unit 106 becomes substantially equal to the resistance value of the reference resistor 107.

The impedance codes CODE<0:4> generated from the impedance code generation circuit adjusts an impedance value of a termination unit (not shown) which is configured in a structure similar to that of the impedance unit 106. As a result, even though PVT conditions vary, the termination unit can have an exact impedance value and terminate an interface node (a node through which signals and data are inputted and outputted).

FIG. 2 is a graph showing the change in the impedance codes CODE<0:4> and the change in the impedance value of the impedance unit 106.

In the graph of FIG. 2, the value of the impedance codes CODE<0:4> decreases (i.e., approaches (1,1,1,1,1)) toward the right side on an X axis, and the value of the impedance codes CODE<0:4> increases (i.e., approaches (0,0,0,0,0)) toward the left side.

As can be seen from the graph of FIG. 2, the change in the impedance codes CODE<0:4> and the change in the impedance value of the impedance unit 106 are not linear (i.e., nonlinear). That is, as the impedance codes CODE<0:4> change by 1 step, as shown in the left side of the graph, the impedance value of the impedance unit 106 greatly changes. However, as the impedance codes CODE<0:4> changes by 1 step toward the right side of the graph, the impedance value of the impedance unit 106 slightly changes.

FIG. 3 illustrates the procedure in which the voltage of the calibration node ZQ converges between the first reference voltage VREF1 and the second reference voltage VREF2 according to the operation of the impedance code generation circuit.

Referring to FIG. 3, as the operation of the impedance code generation circuit is in progress, the voltage of the calibration node ZQ approaches the level between the first reference voltage VREF1 and the second reference voltage VREF2. A concern arises when the change in the impedance value of the impedance unit 106 per 1 step change of the impedance codes CODE<0:4> is small and the voltage of the calibration node ZQ is between the first reference voltage VREF1 and the second reference voltage VREF2, as indicated by reference numeral 301. In this case, the final value of the impedance codes CODE<0:4> may change according to noise components applied to the comparators 102 and 103, and the impedance code generation circuit may be hindered from generating the exact impedance codes CODE<0:4>.

In order to prevent the case indicated by reference numeral 301, a method for reducing the voltage difference between the first reference voltage VREF1 and the second reference voltage VREF2 may be used. However, such a method may be disadvantageous in that the voltage of the calibration node ZQ may not converge to the target voltage in a period in which the impedance value of the impedance unit 106 greatly changes with 1-step change of the impedance codes CODE<0:4>.

SUMMARY OF THE INVENTION

Exemplary embodiments of the present invention are directed to an impedance code generation circuit which can generate desired impedance codes when a change in a resistance value of an impedance unit according to a change in impedance codes is not linear.

In accordance with an exemplary embodiment of the present invention, an impedance code generation circuit includes an impedance unit configured to drive a calibration node to a first level by using an impedance value determined by an impedance code, a code generation unit configured to generate the impedance code so that a voltage of the calibration node has a voltage level between a first reference voltage and a second reference voltage, and a reference voltage generation unit configured to generate the first reference voltage and the second reference voltage in response to the impedance code.

In accordance with another exemplary embodiment of the present invention, an impedance code generation circuit includes a first impedance unit configured to drive a calibration node to a first level by using an impedance value determined by a first impedance code, a dummy impedance unit configured to drive a first node to the first level by using the impedance value determined by the first impedance code, a second impedance unit configured to drive the first node to a second level by using an impedance value determined by a second impedance code, a first code generation unit configured to generate the first impedance code so that a voltage of the calibration node has a level between a first reference voltage and a second reference voltage, a second code generation unit configured to generate the second impedance code so that a voltage of the first node has a level between the first reference voltage and the second reference voltage, and a reference voltage generation unit configured to generate the first reference voltage and the second reference voltage in response to the first impedance code or the second impedance code.

In accordance with yet another exemplary embodiment of the present invention, an integrated circuit includes an impedance unit configured to drive a calibration node to a first level by using an impedance value determined by an impedance code, a code generation unit configured to generate the impedance code so that a voltage of the calibration node has a voltage level between a first reference voltage and a second reference voltage, a reference voltage generation unit configured to generate the first reference voltage and the second reference voltage in response to the impedance code, and a termination unit configured to terminate an interface node by using the impedance value determined by the impedance code.

In accordance with still another exemplary embodiment of the present invention, an integrated circuit includes a pull-up impedance unit configured to pull-up drive a calibration node by using an impedance value determined by a pull-up impedance code, a dummy impedance unit configured to pull-up drive a first node by using the impedance value determined by the pull-up impedance code, a pull-down impedance unit configured to pull-down drive the first node by using an impedance value determined by a pull-down impedance code, a pull-up code generation unit configured to generate the pull-up impedance code so that a voltage of the calibration node has a level between a first reference voltage and a second reference voltage, a pull-down code generation unit configured to generate the pull-down impedance code so that a voltage of the first node has a level between the first reference voltage and the second reference voltage, a reference voltage generation unit configured to generate the first reference voltage and the second reference voltage in response to the pull-up impedance code or the pull-down impedance code, a pull-up termination unit configured to pull-up terminate an interface node by using the impedance value determined by the pull-up impedance code, and a pull-down termination unit configured to pull-down terminate the interface node by using the impedance value determined by the pull-down impedance code.

DESCRIPTION OF SPECIFIC EMBODIMENTS

Figure 1:
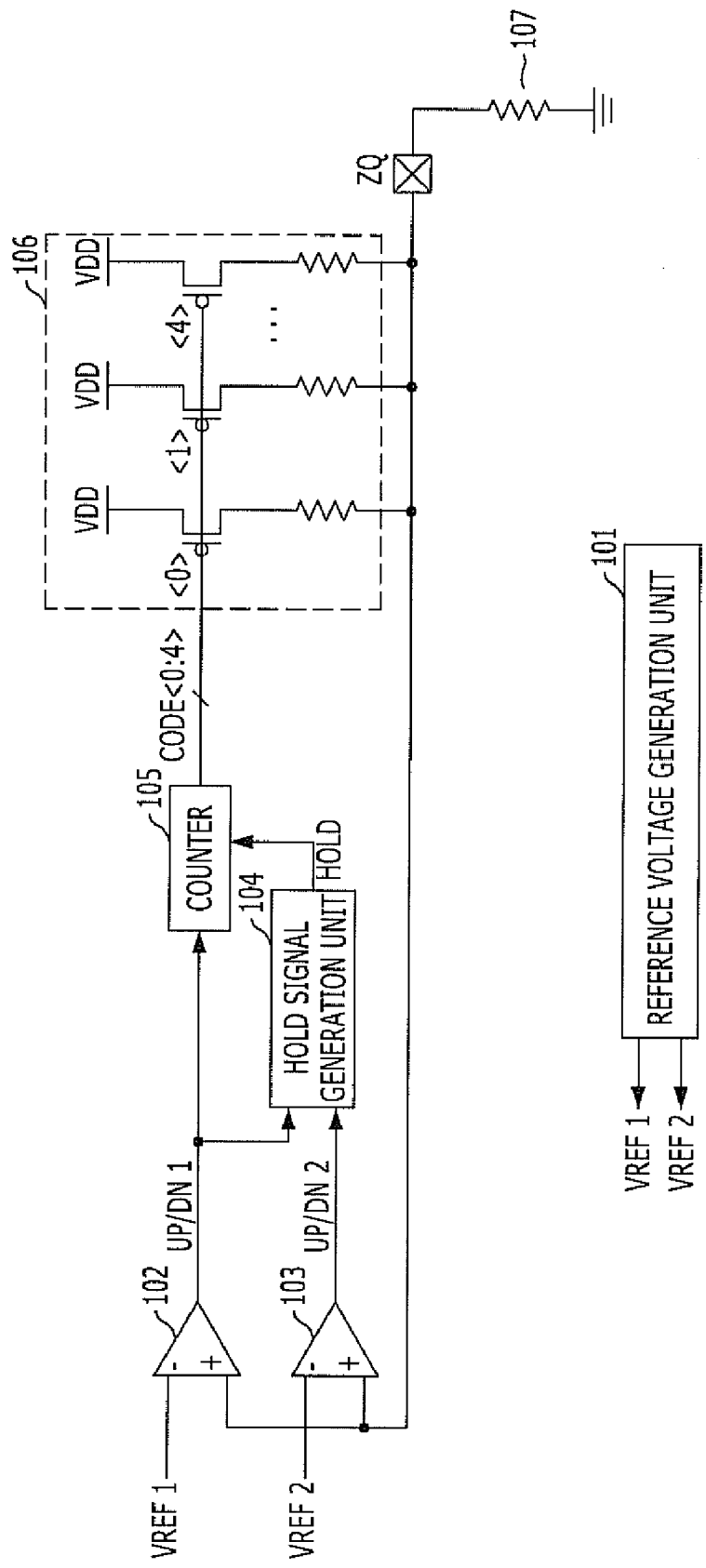
FIG. 1 is a configuration diagram of a known impedance code generation circuit
Figure 2:
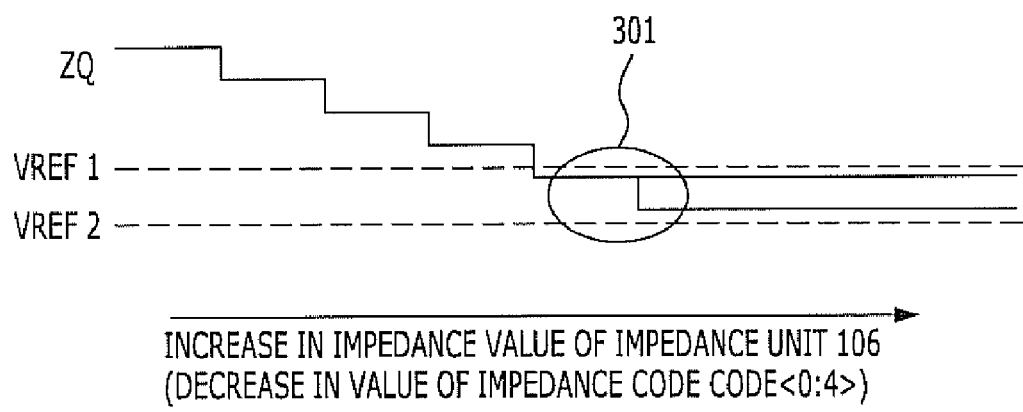
FIG. 2 is a graph showing a change in impedance codes and a change in an impedance value of an impedance unit.
Figure 3:
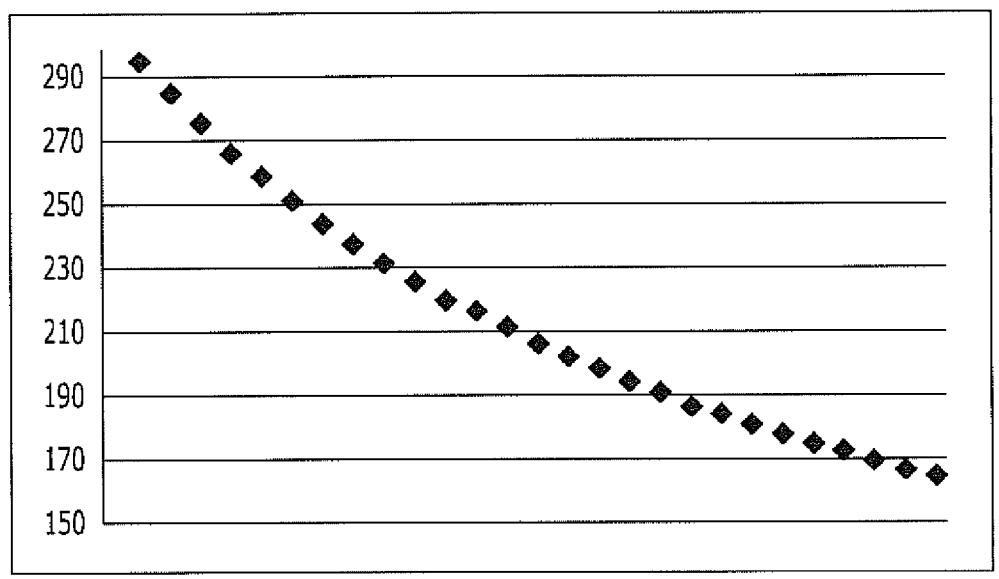
FIG. 3 illustrates the procedure in which a voltage of a calibration node converges between a first reference voltage and a second reference voltage according to the operation of the impedance code generation circuit.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 4:
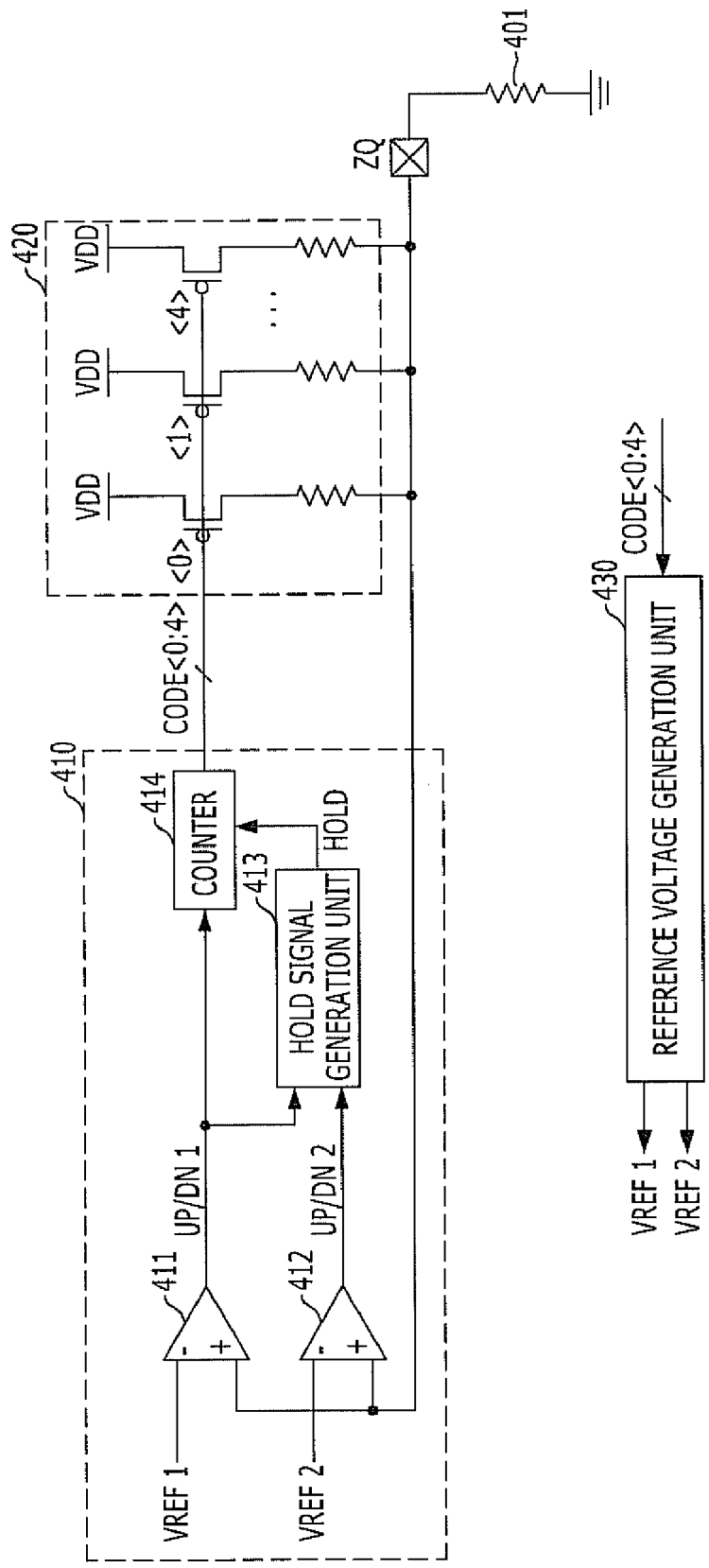
FIG. 4 is a diagram of an impedance code generation circuit in accordance with an exemplary embodiment of the present invention.

FIG. 4 is a diagram of an impedance code generation circuit in accordance with an exemplary embodiment of the present invention.

Referring to FIG. 4, the impedance code generation circuit includes a code generation unit 410, an impedance unit 420, and a reference voltage generation unit 430. The impedance unit 420 drives a calibration node ZQ to a first voltage level by using an impedance value determined by impedance codes CODE<0:4>. The code generation unit 410 generates the impedance codes CODE<0:4> so that a voltage of the calibration node ZQ has a level between a first reference voltage VREF1 and a second reference voltage VREF2. The reference voltage generation unit 430 generates the first reference voltage VREF1 and the second reference voltage VREF2 in response to the impedance codes CODE<0:4>.

The code generation unit 410 generates the impedance codes CODE<0:4> so that the impedance value of the impedance unit 420 becomes similar to the resistance value of a reference resistor 401 coupled to the calibration node ZQ. That is, the impedance codes CODE<0:4> are generated so that the voltage of the calibration node ZQ becomes higher than the voltage level of the second reference voltage VREF2 and lower than the voltage level of the first reference voltage VREF1.

The code generation unit 410 may include a first comparator 411, a second comparator 412, a hold signal generation unit 413, and a counter 414. The first comparator 411 compares the first reference voltage VREF1 with the voltage of the calibration node ZQ and generates a first comparison signal UP/DN1. The second comparator 412 compares the second reference voltage VREF2 with the voltage of the calibration node ZQ and generates a second comparison signal UP/DN2. The hold signal generation unit 413 activates a hold signal HOLD when the first comparison signal UP/DN1 and the second comparison signal UP/DN2 have different logic levels. Otherwise, the hold signal HOLD is deactivated.

The generation of the impedance codes CODE<0:4> is performed by increasing or decreasing the values of the impedance codes CODE<0:4> according to a logic level of the comparison signal UP/DN1. Although it is illustrated that the counter 414 increases/decreases the value of the impedance codes CODE<0:4> in response to the first comparison signal UP/DN1, the same effect can also be obtained when the counter 414 is configured to operate in response to the second comparison signal UP/DN2 instead of the first comparison signal UP/DN1.

The impedance unit 420 pull-up drives the calibration node ZQ by using the impedance value determined by the impedance codes CODE<0:4>. The impedance unit 420 includes transistors which are turned on/off in response to the code values of the impedance codes CODE<0:4>, and resistors which are coupled in series to the respective transistors. Since the transistors used in the impedance unit 420 are PMOS transistors, which are turned on when a logic low level is received at their gate, the impedance value of the impedance unit 420 increases as the value of the impedance codes CODE<0:4> decrease. For example, when the impedance codes CODE<0:4> are [00000] (i.e., value of impedance codes=0) the impedance value of the impedance unit 420 is larger than when the impedance codes CODE<0:4> are [11111] (i.e., value of impedance codes=31).

The reference voltage generation unit 430 generates the first reference voltage VREF1 and the second reference voltage VREF2 in response to the impedance codes CODE<0:4>. While, the known reference voltage generation unit 101 generates the reference voltages having a fixed level, the reference voltage generation unit 430 in accordance with an exemplary embodiment of the present invention changes the levels of the first reference voltage VREF1 and the second reference voltage VREF2 according to the range of the impedance codes CODE<0:4>. Specifically, in a first case, the voltage difference between the first reference voltage VREF1 and the second reference voltage VREF2 is increased during a period in which the impedance value of the impedance unit 420 changes by a relatively great amount with a 1-step change of the impedance codes CODE<0:4>.

In contrast, in a second case, the voltage difference between the first reference voltage VREF1 and the second reference voltage VREF2 is decreased during a period in which the impedance value of the impedance unit 420 changes by a relatively small amount with a 1-step change of the impedance codes CODE<0:4>. For example, in the first case, VREF1=VDD/2+0.2 and VREF2=VDD/2−0.2, while in the second case, VREF1=VDD/2+0.1 and VREF=VDD/2−0.1. The operation of the reference voltage generation unit 430 can alleviate concerns that the impedance value of the impedance unit 420 may change nonlinearly with the change in the impedance codes CODE<0:4>.

It is exemplarily illustrated in FIG. 4 that the reference resistor 401 pull-down drives the calibration node ZQ and the impedance unit 420 pull-up drives the calibration node ZQ. However, it is apparent that the impedance code generation circuit can be designed so that the reference resistor 401 pull-up drives the calibration node ZQ and the impedance unit 420 pull-down drives the calibration node ZQ.

Figure 5:
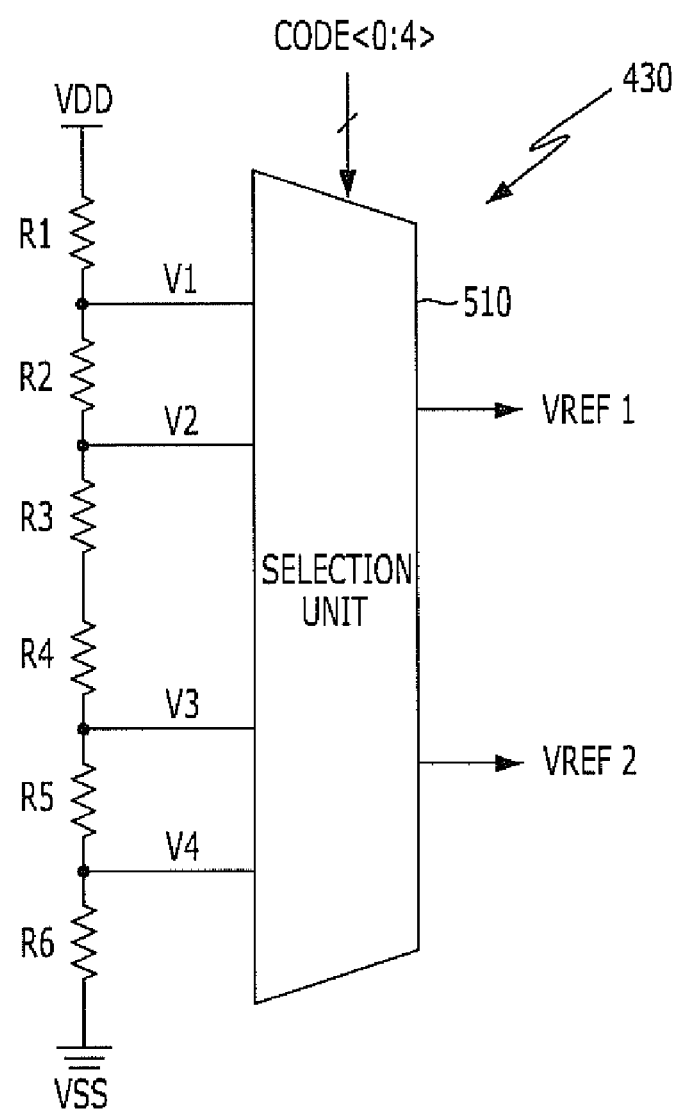
FIG. 5 is a diagram of a reference voltage generation unit illustrated in FIG. 4.

FIG. 5 is a diagram of the reference voltage generation unit 430 illustrated in FIG. 4.

Referring to FIG. 5, the reference voltage generation unit 430 includes a plurality of resistors R1 to R6 and a selection unit 510. The plurality of resistors R1 to R6 are coupled in series between the power supply voltage (VDD) terminal and the ground voltage (VSS) terminal and generate a plurality of division voltages V1 to V4. Herein, voltage levels of the division voltages V1 to V4 are different and are related to one another as follows: V1<V2<V3<V4. The selection unit 510 selectively outputs the plurality of division voltages V1 to V4 as the first reference voltage VREF1 and the second reference voltage VREF2 in response to the value of the impedance codes CODE<0:4>.

The selection unit 510 selects the division voltage V1 as the first reference voltage VREF1 and the division voltage V4 as the second reference voltage VREF2 during a period in which the impedance value of the impedance unit 420 changes by a relatively great amount with the change in the value of the impedance codes CODE<0:4>. Alternatively, the selection unit 510 selects the division voltage V2 as the first reference voltage VREF1 and the division voltage V3 as the second reference voltage VREF2 during a period in which the impedance value of the impedance unit 420 changes by a relatively small amount with the change in the value of the impedance codes CODE<0:4>.

For example, the selection unit 510 may select the division voltages V1 to V4 such that the division voltage V1 and the division voltage V4 become the first reference voltage VREF1 and the second reference voltage VREF2, respectively, during a period in which the impedance codes CODE<0:4> are smaller than (1,1,0,0,0), and the division voltage V2 and the division voltage V3 become the first reference voltage VREF1 and the second reference voltage VREF2, respectively, during a period in which the impedance codes CODE<0:4> are larger than (1,1,0,0,0).

The resistance values of the resistors R1 to R6 may be R1=R6, R2=R5, and R3=R4. In this case, the first reference voltage VREF1 and the second reference voltage VREF2 can ensure the same margin with respect to VDD/2. That is, VREF1 may be VDD/2+α and VREF2 may be VDD/2−α.

Figure 6:
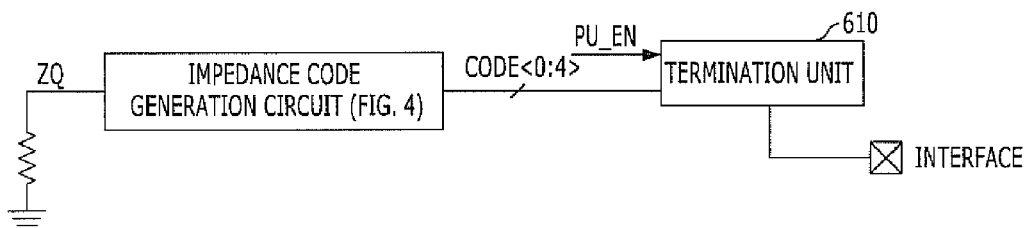
FIG. 6 is a diagram of an integrated circuit including the impedance code generation circuit of FIG. 4 and a termination unit which performs a termination operation using impedance codes.

FIG. 6 is a diagram of an integrated circuit including the impedance code generation circuit of FIG. 4 and a termination unit which performs a termination operation using the impedance codes CODE<0:4>.

Referring to FIG. 6, the impedance codes CODE<0:4> generated from the impedance code generation circuit of FIG. 4 are inputted to the termination unit 610. The termination unit 610 has the impedance value adjusted by the impedance codes CODE<0:4> and terminates an interface node INTERFACE. Since the impedance value of the termination unit 610 is adjusted by the impedance codes CODE<0:4>, the termination unit 610 can operate with the exact impedance value necessary for impedance matching.

The interface node INTERFACE refers to a node through which data or signals are inputted and outputted. A termination enable signal PU_EN inputted to the termination unit 610 is a signal for enabling or disabling the termination unit 610. That is, the termination unit 610 is enabled or disabled in response to the termination enable signal PU_EN. When the termination unit 610 is enabled, the impedance value of the termination unit 610 is adjusted by the impedance codes CODE<0:4>.

Figure 7:
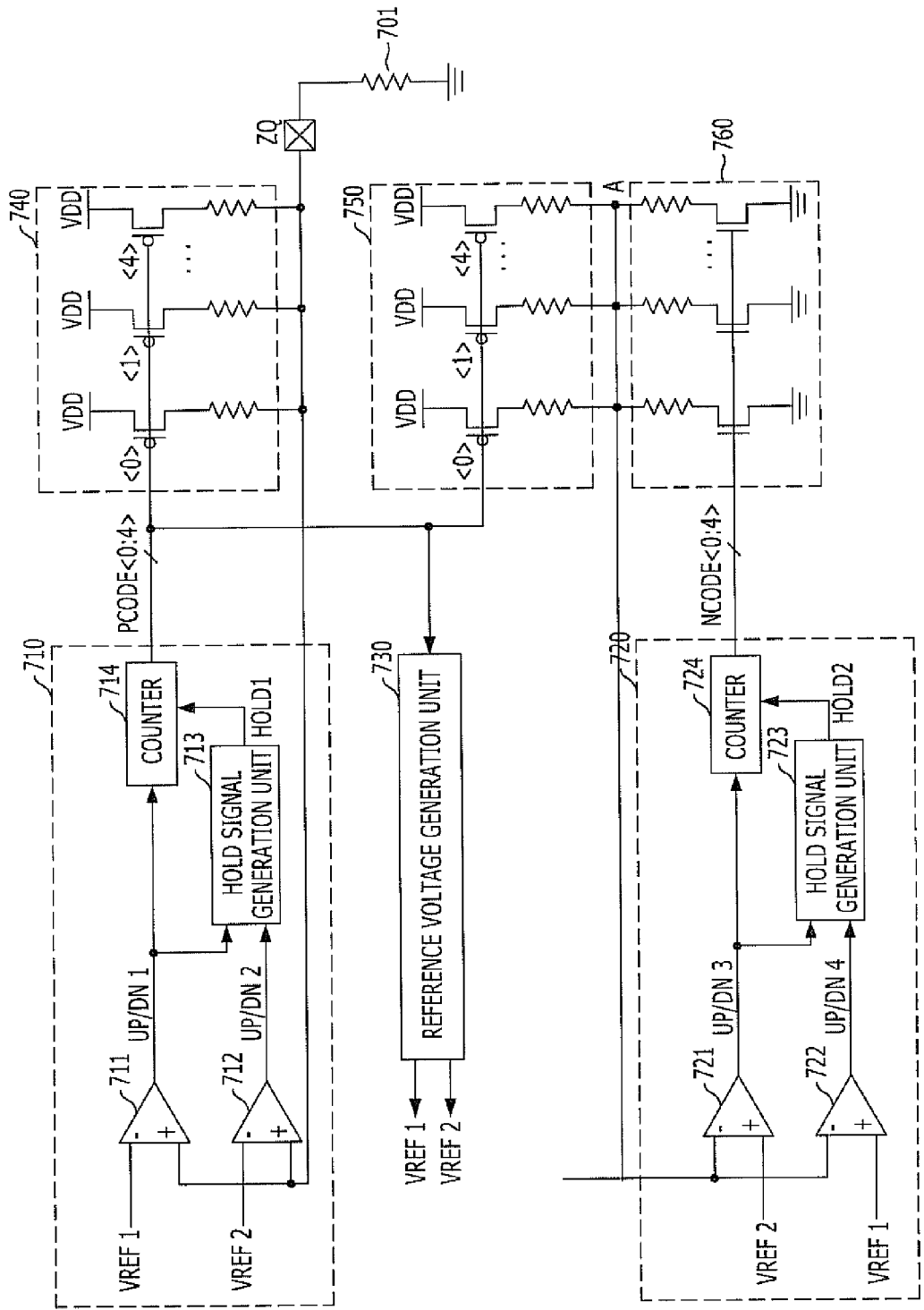
FIG. 7 is a diagram of an impedance code generation circuit in accordance with another exemplary embodiment of the present invention.

FIG. 7 is a diagram of an impedance code generation circuit in accordance with another exemplary embodiment of the present invention.

Referring to FIG. 7, the impedance code generation circuit includes a first impedance unit 740, a dummy impedance unit 750, a second impedance unit 760, a first code generation unit 710, a second code generation unit 720, and a reference voltage generation unit 730.

The first impedance unit 740 drives a calibration node ZQ to a first level by using an impedance value determined by first impedance codes PCODE<0:4>. The dummy impedance unit 750 drives a node A to the first level by using the impedance value determined by the first impedance codes PCODE<0:4>. The second impedance unit 760 drives the node A to a second level by using an impedance value determined by second impedance codes NCODE<0:4>. The first code generation unit 710 generates the first impedance codes PCODE<0:4> so that the voltage of the calibration node ZQ has a level between a first reference voltage VREF1 and a second reference voltage VREF2. The second code generation unit 720 generates the second impedance codes NCODE<0:4> so that the voltage of the node A has a level between a first reference voltage VREF1 and a second reference voltage VREF2.

In the exemplary embodiment shown in FIG. 7, the reference voltage generation unit 730 generates the first reference voltage VREF1 and the second reference voltage VREF2 in response to the first impedance codes PCODE<0:4>. However, the reference voltage generation unit 730 of another exemplary embodiment may generate the first reference voltage VREF1 and the second reference voltage VREF2 in response to the second impedance codes NCODE<0:4>.

FIG. 7 exemplarily illustrates that the reference resistor 701 pull-down drives the calibration node ZQ. Therefore, in FIG. 7, the first impedance unit 740 pull-up drives the calibration node ZQ, and the dummy impedance unit 750 pull-up drives the node A. The second impedance unit 760 pull-down drives the node A. In addition, the first impedance codes generated from the first code generation unit 710 are the pull-up impedance codes PCODE<0:4>, and the second impedance codes generated from the second code generation unit 720 are the pull-down impedance codes NCODE<0:4>.

Unlike the example of FIG. 7, when the reference resistor 701 is designed to pull-up drive the calibration node ZQ, the first impedance unit 740 pull-down drives the calibration node ZQ, while the dummy impedance unit 750 pull-down drives the node A and the second impedance unit 760 pull-up drives the node A. In this case, the first impedance codes generated from the first code generation unit 710 are the pull-down impedance codes NCODE<0:4>, and the second impedance codes generated from the second code generation unit 720 are the pull-up impedance codes PCODE<0:4>. Hereinafter, the case opposite to that of FIG. 7 will be described for convenience.

The first code generation unit 710 and the first impedance unit 740 of FIG. 7 operate in the same manner as the code generation unit 410 and the impedance unit 420 of FIG. 4, respectively.

The dummy impedance unit 750 is configured with the same structure as the first impedance unit 740 and has the same impedance value as the first impedance unit 740 because it receives the pull-up impedance codes PCODE<0:4>. However, the dummy impedance unit 750 is different from the first impedance unit 740 in that it pull-up drives the node A, instead of the calibration node ZQ.

The second impedance unit 760 has the impedance value determined by the pull-down impedance codes NCODE<0:4> and pull-down drives the node A.

The second code generation unit 720 has the same structure as the first code generation unit 710. However, the second code generation unit 720 is different from the first code generation unit 710 in that it generates the pull-down codes NCODE<0:4> by using the voltage of the node A, instead of the voltage of the calibration node ZQ. When the operation of the second code generation unit 720 is completed, the second code generation unit 720 generates the pull-down impedance codes NCODE<0:4> so that the pull-down impedance unit 760 has the same impedance value as the dummy impedance unit 750.

When the operation of the impedance code generation circuit is completed, the reference resistor 701, the first impedance unit 740, the dummy impedance unit 750, and the second impedance unit 760 have the substantially same impedance value.

The reference voltage generation unit 730 generates the first reference voltage VREF1 and the second reference voltage VREF2 in response to the pull-up impedance codes PCODE<0:4>. The structure and operation of the reference voltage generation unit 730 are the same as those of the reference voltage generation unit 430 of FIG. 4. Although it is illustrated in FIG. 7 that the reference voltage generation unit 730 generates the first reference voltage VREF1 and the second reference voltage VREF2 in response to the pull-up impedance codes PCODE<0:4>, the reference voltage generation unit 730 may also be designed to generate the first reference voltage VREF1 and the second reference voltage VREF2 in response to the pull-down impedance codes NCODE<0:4> because the pull-down impedance codes NCODE<0:4> have the substantially same information as the pull-up impedance codes PCODE<0:N>.

Since the impedance code generation circuit of FIG. 7 operates in the same manner as the impedance code generation circuit of FIG. 4, except that the impedance code generation circuit of FIG. 7 generates two impedance codes PCODE<0:4> and NCODE<0:4>, a detailed description thereof will be omitted.

Figure 8:
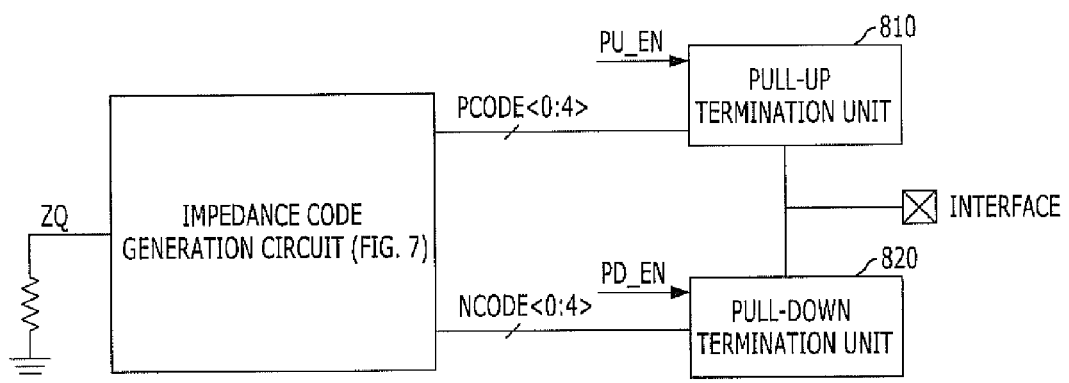
FIG. 8 is a diagram of an integrated circuit including the impedance code generation circuit of FIG. 7 and a termination unit which performs a termination operation using impedance codes.

FIG. 8 is a diagram of an integrated circuit including the impedance code generation circuit of FIG. 7 and a termination unit which performs a termination operation using the impedance codes PCODE<0:4> and NCODE<0:4>.

Referring to FIG. 8, the pull-up impedance codes PCODE<0:4> generated from the first code generation unit 710 of the impedance code generation circuit of FIG. 7 are inputted to a pull-up termination unit 810, and the pull-down impedance codes NCODE<0:4> generated from the second code generation unit 720 are inputted to a pull-down termination unit 820. The pull-up termination unit 810 has the impedance value adjusted by the pull-up impedance codes PCODE<0:4> and pull-up termination unit 810 terminates an interface node INTERFACE. In addition, the pull-down termination unit 820 has the impedance value adjusted by the pull-down impedance codes NCODE<0:4> and pull-down termination unit 820 terminates the interface node INTERFACE.

Since the impedance value of the pull-up termination unit 810 is adjusted by the pull-up impedance codes PCODE<0:4> and the impedance value of the pull-down termination unit 820 is adjusted by the pull-down impedance codes NCODE<0:4>, the pull-up termination unit 810 and the pull-down termination unit 820 can operate with the exact impedance values necessary for impedance matching.

A pull-up termination enable signal PU_EN inputted to the pull-up termination unit 810 is a signal for enabling or disabling the pull-up termination unit 810, and a pull-down termination enable signal PD_EN inputted to the pull-down termination unit 820 is a signal for enabling or disabling the pull-down termination unit 820. That is, the pull-up termination unit 810 and the pull-down termination unit 820 are enabled or disabled in response to the pull-up termination enable signal PU_EN and the pull-down termination enable signal PD_EN, respectively. When the pull-up termination unit 810 and the pull-down termination unit 820 are enabled, the impedance values of the pull-up termination unit 810 and the pull-down termination unit 820 are adjusted by the pull-up impedance codes PCODE<0:4> and the pull-down impedance codes NCODE<0:4>, respectively.

The pull-up termination unit 810 and the pull-down termination unit 820 may be used as an output driver for outputting data to the outside of the integrated circuit. When the pull-up termination enable signal PU_EN is activated, the pull-up termination unit 810 pull-up terminates the interface node INTERFACE and thus high data is outputted through the interface node INTERFACE. When the pull-down termination enable signal PD_EN is activated, the pull-down termination unit 810 pull-down terminates the interface node INTERFACE and thus low data is outputted through the interface node INTERFACE.

In accordance with exemplary embodiments of the present invention, the level difference between two reference voltages used in the impedance code generation circuit is adjusted according to the impedance codes. Therefore, it is possible to alleviate concerns that the impedance value of the impedance unit nonlinearly changes with the change in the impedance codes. That is, the optimal or exact impedance codes can be generated, without regard to whether the impedance codes have a large value or a small value.

While the present invention has been described with respect to the specific embodiments, it will be apparent to those skilled in the art that various changes and modifications may be made without departing from the spirit and scope of the invention as defined in the following claims.

What is claimed is:

1. An impedance code generation circuit comprising:
   an impedance unit configured to drive a calibration node to a first level by using an impedance value determined by an impedance code;
   a code generation unit configured to generate the impedance code so that a voltage of the calibration node has a voltage level between a first reference voltage and a second reference voltage; and
   a reference voltage generation unit configured to generate the first reference voltage and the second reference voltage in response to the impedance code,
   wherein the code generation unit comprises:
      a first comparator configured to compare the first reference voltage with the voltage of the calibration node and generate a first comparison signal;
      a second comparator configured to compare the second reference voltage with the voltage of the calibration node and generate a second comparison signal;
      a hold signal generation unit configured to activate a hold signal when the first comparison signal and the second comparison signal have different logic levels; and
      a counter configured to generate the impedance code in response to the first comparison signal or the second comparison signal, and fix the value of the impedance code when the hold signal is activated.

2. The impedance code generation circuit of claim 1, further comprising a reference resistor coupled to the calibration node to drive the calibration node to a second level.

3. The impedance code generation circuit of claim 1, wherein the reference voltage generation unit increases or decreases a voltage difference between the first reference voltage and the second reference voltage according to a value of the impedance code.

4. The impedance code generation circuit of claim 3, wherein the reference voltage generation unit increases the voltage difference between the first reference voltage and the second reference voltage during a period in which the impedance value of the impedance unit changes by a relatively great amount with a change in the value of the impedance code, and the reference voltage generation unit decreases the voltage difference between the first reference voltage and the second reference voltage during a period in which the impedance value of the impedance unit changes by a relatively small amount with a change in the value of the impedance code.

5. The impedance code generation circuit of claim 1, wherein the reference voltage generation unit comprises:
   a plurality of resistors coupled in series between a power supply voltage terminal and a ground voltage terminal in order to generate a plurality of division voltages; and
   a selection unit configured to selectively output the plurality of division voltages as the first reference voltage and the second reference voltage in response to the value of the impedance code.

6. An impedance code generation circuit comprising:
   a first impedance unit configured to drive a calibration node to a first level by using an impedance value determined by a first impedance code;
   a dummy impedance unit configured to drive a first node to the first level by using the impedance value determined by the first impedance code;
   a second impedance unit configured to drive the first node to a second level by using an impedance value determined by a second impedance code;
   a first code generation unit configured to generate the first impedance code so that a voltage of the calibration node has a level between a first reference voltage and a second reference voltage;
   a second code generation unit configured to generate the second impedance code so that a voltage of the first node has a level between the first reference voltage and the second reference voltage; and
   a reference voltage generation unit configured to generate the first reference voltage and the second reference voltage in response to the first impedance code or the second impedance code;
   wherein the first code generation unit comprises:
     a first comparator configured to compare the first reference voltage with the voltage of the calibration node and generate a first comparison signal;
     a second comparator configured to compare the second reference voltage with the voltage of the calibration node and generate a second comparison signal;
     a first hold signal generation unit configured to activate a first hold signal when the first comparison signal and the second comparison signal have different logic levels; and
     a first counter configured to generate the first impedance code in response to the first comparison signal or the second comparison signal, and fix the value of the first impedance code when the first hold signal is activated,
   and wherein the second code generation unit comprises:
     a third comparator configured to compare the first reference voltage with the voltage of the first node and generate a third comparison signal;
     a fourth comparator configured to compare the second reference voltage with the voltage of the first node and generate a fourth comparison signal;
     a second hold signal generation unit configured to activate a second hold signal when the third comparison signal and the fourth comparison signal have different logic levels; and
     a second counter configured to generate the second impedance code in response to the third comparison signal or the fourth comparison signal, and fix the value of the second impedance code when the second hold signal is activated.

7. The impedance code generation circuit of claim 6, further comprising a reference resistor coupled to the calibration node to drive the calibration node to the second level.

8. The impedance code generation circuit of claim 6, wherein the reference voltage generation unit increases or decreases a voltage difference between the first reference voltage and the second reference voltage according to a value of the first impedance code or the second impedance code.

9. The impedance code generation circuit of claim 8, wherein the reference voltage generation unit increases the voltage difference between the first reference voltage and the second reference voltage during a period in which the impedance value of the first impedance unit or the second impedance unit changes by a relatively great amount with a change in the value of the first impedance code or the second impedance code, and the reference voltage generation unit decreases the voltage difference between the first reference voltage and the second reference voltage during a period in which the impedance value of the first impedance unit or the second impedance unit changes by a relatively small amount with a change in the value of the first impedance code or the second impedance code.

10. An integrated circuit comprising:
    an impedance unit configured to drive a calibration node to a first level by using an impedance value determined by an impedance code;
    a code generation unit configured to generate the impedance code so that a voltage of the calibration node has a voltage level between a first reference voltage and a second reference voltage;
    a reference voltage generation unit configured to generate the first reference voltage and the second reference voltage in response to the impedance code; and
    a termination unit configured to terminate an interface node by using an impedance value determined by the impedance code,
    wherein the code generation unit comprises:
      a first comparator configured to compare the first reference voltage with the voltage of the calibration node and generate a first comparison signal;
      a second comparator configured to compare the second reference voltage with the voltage of the calibration node and generate a second comparison signal;
      a hold signal generation unit configured to activate a hold signal when the first comparison signal and the second comparison signal have different logic levels; and
      a counter configured to generate the impedance code in response to the first comparison signal or the second comparison signal, and fix the value of the impedance code when the hold signal is activated.

11. The integrated circuit of claim 10, wherein the impedance value of the termination unit matches the impedance value of the impedance unit.

12. The integrated circuit of claim 10, wherein the termination unit is enabled in response to a termination enable signal.

13. The integrated circuit of claim 10, further comprising a reference resistor coupled to the calibration node to drive the calibration node to a second level.

14. The integrated circuit of claim 10, wherein the interface node is a data input/output node through which data is outputted from the integrated circuit or data is inputted to the integrated circuit.

15. The integrated circuit of claim 10, wherein the reference voltage generation unit increases or decreases a voltage difference between the first reference voltage and the second reference voltage according to a value of the impedance code.

16. The integrated circuit of claim 15, wherein the reference voltage generation unit increases the voltage difference between the first reference voltage and the second reference voltage during a period in which the impedance value of the impedance unit changes by a relatively great amount with a change in the value of the impedance code, and the reference voltage generation unit decreases the voltage difference between the first reference voltage and the second reference voltage during a period in which the impedance value of the impedance unit changes by a relatively small amount with a change in the value of the impedance code.

17. An integrated circuit comprising:
a pull-up impedance unit configured to pull-up drive a calibration node by using an impedance value determined by a pull-up impedance code;
a dummy impedance unit configured to pull-up drive a first node by using the impedance value determined by the pull-up impedance code;
a pull-down impedance unit configured to pull-down drive the first node by using an impedance value determined by a pull-down impedance code;
a pull-up code generation unit configured to generate the pull-up impedance code so that a voltage of the calibration node has a level between a first reference voltage and a second reference voltage;
a pull-down code generation unit configured to generate the pull-down impedance code so that a voltage of the first node has a level between the first reference voltage and the second reference voltage;
a reference voltage generation unit configured to generate the first reference voltage and the second reference voltage in response to the pull-up impedance code or the pull-down impedance code;
a pull-up termination unit configured to pull-up terminate an interface node by using the impedance value determined by the pull-up impedance code; and
a pull-down termination unit configured to pull-down terminate the interface node by using an impedance value determined by the pull-down impedance code,
wherein the pull-up code generation unit comprises:
a first comparator configured to compare the first reference voltage with the voltage of the calibration node and generate a first comparison signal;
a second comparator configured to compare the second reference voltage with the voltage of the calibration node and generate a second comparison signal;
a first hold signal generation unit configured to activate a first hold signal when the first comparison signal and the second comparison signal have different logic levels; and
a first counter configured to generate the pull-up impedance code in response to the first comparison signal or the second comparison signal, and fix the value of the pull-up impedance code when the first hold signal is activated,
and wherein the pull-down code generation unit comprises:
a third comparator configured to compare the first reference voltage with the voltage of the first node and generate a third comparison signal;
a fourth comparator configured to compare the second reference voltage with the voltage of the first node and generate a fourth comparison signal;
a second hold signal generation unit configured to activate a second hold signal when the third comparison signal and the fourth comparison signal have different logic levels; and
a second counter configured to generate the pull-down impedance code in response to the third comparison signal or the fourth comparison signal, and fix the value of the second impedance code when the second hold signal is activated.

18. The integrated circuit of claim 17, further comprising a reference resistor coupled to the calibration node to pull-down drive the calibration node.

19. The integrated circuit of claim 18, wherein the interface node is coupled to a data pad, the pull-up termination unit is enabled when high data is outputted through the data pad, and the pull-down termination unit is enabled when low data is outputted through the data pad.

20. The integrated circuit of claim 17, wherein the reference voltage generation unit increases or decreases a voltage difference between the first reference voltage and the second reference voltage according to a value of the pull-up impedance code or the pull-down impedance code.

21. The integrated circuit of claim 20, wherein the reference voltage generation unit increases the voltage difference between the first reference voltage and the second reference voltage during a period in which the impedance value of the pull-up impedance unit or the pull-down impedance unit changes by a relatively great amount with a change in the value of the pull-up impedance code or the pull-down impedance code, and the reference voltage generation unit decreases the voltage difference between the first reference voltage and the second reference voltage during a period in which the impedance value of the pull-up impedance unit or the pull-down impedance unit changes by a relatively small amount with a change in the value of the pull-up impedance code or the pull-down impedance code.

* * * * *